United States Patent [19]

Luich et al.

[11] Patent Number: 4,969,124
[45] Date of Patent: Nov. 6, 1990

[54] METHOD FOR VERTICAL FUSE TESTING

[75] Inventors: Thomas M. Luich, Campbell; Michael S. Millhollan, Saratoga, both of Calif.

[73] Assignee: National Semiconductor Corporation, Santa Clara, Calif.

[21] Appl. No.: 320,762

[22] Filed: Mar. 7, 1989

[51] Int. Cl.⁵ .............................................. G11C 17/16
[52] U.S. Cl. ................... 365/201; 365/225.7; 365/96
[58] Field of Search ................ 365/96, 103, 104, 105, 365/175, 201, 225.7; 324/73 PC; 371/21

[56] References Cited

U.S. PATENT DOCUMENTS

| 3,848,238 | 11/1974 | Rizzi et al. | 365/105 |
| 4,595,875 | 6/1986 | Chan et al. | 365/96 X |
| 4,701,695 | 10/1987 | Chan et al. | 371/21 |

Primary Examiner—Joseph A. Popek
Attorney, Agent, or Firm—Steven F. Caserza; Lee Patch

[57] ABSTRACT

A method and structure is provided to test for leakage currents in a fuse array. A diode is connected to each column in the array in order to isolate the column from the test circuitry during normal operation of the device. During testing, current is fed through a diode to a column, and the corresponding leakage current is measured. In one embodiment, the anodes of each diode are connected in common to a single test point, and the total leakage current from the entire fuse array is measured simultaneously. In another embodiment, addressing means are used to selectively address a desired one of the test diodes and thus a corresponding one of the columns such that leakage current through a single column. In another embodiment, regardless whether all of the columns are simultaneously accessed or are addressed individually, rows are individually addressed in order to enable measurement of leakage current of either a single fuse, or the total leakage current of the fuses associated with an entire row, respectively.

16 Claims, 3 Drawing Sheets

METHOD FOR VERTICAL FUSE TESTING

INTRODUCTION

Background

This invention pertains to programmable devices and more particularly to a method and structure for verifying that an unprogrammed open fuse has a sufficiently high impedance.

Programmable devices such as programmable logic arrays (PLAs) and Programmable Read Only Memories (PROMs) are well known in the prior art. One type of fuses used in such programmable devices is a bipolar transistor as shown in FIG. 1 having its base floating, its emitter serving as one terminal of a fuse, and its collector serving as a second terminal of the fuse. As manufactured, the transistor does not conduct current between its collector and emitter, and thus is "open". During programming, a relatively large amount of current is passed from the emitter to the collector, thereby shorting out the base emitter junction, and providing a programmed transistor which is the equivalent of a diode having the shorted base and emitter serving as the anode, and the collector serving as the cathode, as shown in FIG. 1.

Such programmable devices are manufactured with all fuses intact (open) and, after manufacture, desired ones of the fuses are programmed (shorted), in order to provide a desired programmed pattern.

The advantages of programmable devices are that a large number of devices can be manufactured at relatively low cost and shipped to end users, who can then program relatively few devices to their specific pattern. It is important, of course, to provide such users with devices whose fuses are initially intact, and yet which can be programmed by the user. Devices which do not have all fuses intact initially, or which contain fuses which cannot be opened during programming, are failures.

Accordingly a number of techniques have been used to test programmable devices prior to shipment to end users and thus prior to programming. A very simple test is to determine that the fuses are all intact initially. However, additional testing is needed, for example to ensure that short circuits do not exist which will prevent adequate current from flowing through a fuse which is desired to be programmed, which would thus prevent programming of that fuse. Such a technique is described in U.S. Pat. No. 4,670,708. Another prior art circuit detects shorts between bit lines and word lines and as described in U.S. Pat. Nos. 4,595,875 and 4,701,695. U.S. Pat. No. 4,625,162 describes yet another technique for determining if a fuse itself is shorted, thereby preventing it from being opened during programming.

An example of a typical prior art device which includes fuse devices is shown in the schematic diagram of FIG. 2. Fuse array 108 includes a plurality of fuses 185-1-1 through 185-M-N arranged in an array including a plurality of row lines 190-1 through 190-N and column lines 180-1 through 180-M, with each fuse being uniquely connected between a single column line and a single row line. In this manner, by properly addressing a single row line and a single column line, an individual fuse can be addressed. A plurality of row drivers, such as row driver 106-N are used to selectively enable a desired one of row lines 190-1 through 190-N. As shown in FIG. 2, row driver 106-N includes pull up transistor 160 and a pull down transistor 162 which are controlled by complementary signals applied to their bases via terminals 163 and 164, respectively.

Decoder array 104 is used in order to select a desired one of columns 180-1 through 180-M. Associated with each column 180-1 through 180-M is a plurality of diodes 141-1-1 through 141-M-N having their anodes connected in common and their cathodes connected to the output leads of drivers 130-1 through 130-N, respectively, of column decode driver 103.

In reality, not all of diodes 140-1-1 through 141-M-N are present, but sufficient diodes are present to provide a decoding technique such that a specific set of signals from drivers 130-1 through 130-N will select but a single one of columns 180-1 through 180-M. Fusing driver array 105 includes a set of fusing drivers associated with each column. Thus, for example, column 180-1 has associated with it fusing drivers 150-1 and 151-1. Rows 190-1 through 190-N also have associated therewith programming row drivers such as driver 139-N. Programming row drivers provide far greater amounts of current that is available by reading row drivers such as driver 106-N.

During programming, a fusing voltage (typically 10-15 volts) is supplied to fusing pad 101. With a high programming voltage applied to fusing pad 101, a zener diode 122, having a zener breakdown voltage of approximately 5.5 volts, breaks down, and a PNP transistor 120 having a base threshold voltage of approximately 0.8 volts, turns on. Conducting transistor 120 supplies sufficient base drive to transistor 123 to turn it on and in turn provides sufficient base drive to transistor 125 to turn on transistor 125, thus causing the fusing voltage applied to fusing pad 101 to be made available at the emitter of transistor 125. With the fusing voltage available on the emitter of transistor 125, fusing drivers 150-1 and 151-1 (in the case of column 180-1) turn on when the voltage applied to the base of transistor 151-1 from diodes 141-1-1 through 141-1-N is high (i.e. when column 180-1 is selected by drivers 130-1 through 130-N). This allows fusing current to flow from fusing pad 101, through transistor 125, through transistors 150-1 and 151-1, to column 180-1. With a selected one of rows 190-1 through 190-N selected by its corresponding programming row driver, such as programming row driver 139-N, so as to sink current from its associated row line, programming current is passed through the selected fuse device connected between column 180-1 and the selected row, thus opening that fuse device.

During reading, the programming voltage is removed from fusing pad 101, and fusing driver 105 is disabled by the action of decode driver 103. A selected one of rows 190-1 through 190-N is enabled by its associated row driver pulling down the selected row. Suitable sense amplifiers, such as sense amplifier 195-M are connected to columns 180-1 through 180-M and detect if the fuse associated with the selected row and that column is open or shorted.

One prior art technique for determining whether fuses 185-1-1 through 185-M-N are intact prior to shipment is by using an emitter integrity test. This test forces a predetermined amount of current through each fuse via fusing pad 101. The voltage required to force this predetermined current is measured in order to determine the impedance of the entire path, including the fuse under test. The emitter integrity test serves to verify the integrity of the fusing path, including the fuse device, but is not useful to more precisely determine the impedance of an open or shorted fuse. However, even with an open fuse, current $I_1$ (typically 2-6 milliamps) will flow from fusing pad 101 through transistor 120 and resistor 121 to ground, current $I_2$ (typically 200 μA) will flow through transistor 123 and resistor 124 to ground, and current $I_3$ (typically 3-6 milliamps) will flow through resistors 140-1 through 140-M through diodes 141-1-1 through 141-M-N and transistors 151-1 through 151-M. Furthermore, a parasitic transistor 153 exists between the emitter of transistors 150-1 through 150-M and the substrate, as shown in FIG. 2. This transistor also draws an additional current $I_4$. Accordingly, with this much current flowing during the emitter integrity test, it is not possible to detect small leakage currents, on the order of one microamp total for the entire fuse array 108.

Another prior art test to detect open fuse resistance is to utilize the verify circuitry. The verify circuitry is used during programming to ensure that a fuse being programmed has in fact been programmed. This verification, since it does not require rapid speed, is performed using the programming row driver circuit used during programming. FIG. 3 is a schematic diagram showing such a programming row driver circuit 139-N connected to a row line 402 and having a fuse 401 connected to column 403. Sense amplifier 405 is connected to column 403 for sensing the voltage level on column 403 which in turn is related to program state of fuse 401. With an enabling (logical one) signal applied to terminal 314, row line 402 is pulled to a level equal to Vbe (317)+Vbe (316)+Vbe (315)−Vsch; where Vbe (315) is the base-emitter voltage of transistor 315;

The Vbe (316) is the base-emitter voltage of transistor 316;

Vbe (317) is the base-emitter voltage of transistor 317; and

Vsch is the Schottky voltage between the base and collector of Schottky transistor 315.

For a typical Vbe of 0.8 volts and Vsch of approximately 0.5 volts, programming row driver 139-N pulls row line 402 to a level of approximately 1.9 volts when row line 402 is selected. A shorted fuse 401 will have a base-emitter voltage of approximately 0.9 volts. An open (unprogrammed) fuse 401 will have substantially no current flowing through it, and thus resistor 404 connected to a positive supply voltage Vbe will pull column 403 up to 5 volts. Conversely, with fuse 401 programmed, i.e. shorted, column 403 will be pulled down to a voltage equal to the row line voltage (approximately 1.9 volts) plus the base-emitter voltage drop of fuse 401 (approximately 0.9 volts). Thus, column 403 will swing from approximately 5 volts when fuse 401 is open to approximately 5−2.8 volts=2.2 volts when transistor 401 is shorted. Since amplifier 405 is designed to have a threshold voltage possibly in the middle of this range, i.e. at approximately 1.1 volts of swing. Thus, for a typical resistance value of resistor 404 of approximately 11 k ohms it would require 100 microamps of leakage current to be made available on column 403 in order to pull down column 403 to a sufficient amount to cause sense amplifier 405 to detect such leakage current. Unfortunately, in todays circuits, 100 microamps is considered a tremendous amount of leakage, and it is desired to detect far smaller values of leakage current, on the order of one microamp, for example. Leakage currents greater than this amount, while not causing a catastrophic failure in preventing programming or proper reading of a fuse, will cause significant degradation in the ability to read the data on a column. Furthermore, for higher speed devices the value of column pull up resistor 404 is reduced, making sense amplifier 405 even more insensitive to leakage currents.

SUMMARY

In accordance with the teachings of this invention, a novel method and structure is provided to test for leakage currents in a fuse array. In accordance with the teachings of this invention, a diode is connected to each column in the array in order to isolate the column from the test circuitry during normal operation of the device. During testing, current is fed through the diode to the column, and the corresponding leakage current is measured. In one embodiment of this invention, the anodes of each diode are connected in common to a single test point, and the total leakage current from the entire fuse array is measured simultaneously. In another embodiment of this invention, addressing means are used to selectively address a desired one of the test diodes and thus a corresponding one of the columns such that leakage current through a single column is measured at any given time. In another embodiment of this invention, regardless of whether all of the columns are simultaneously addressed or are addressed individually, rows are individually addressed in order to enable measurement of leakage current of either a single fuse, or the total leakage current of the fuses associated with an entire row, respectively, at any given time.

DETAILED DESCRIPTION OF THE SPECIFIC EMBODIMENTS

Figure 1:
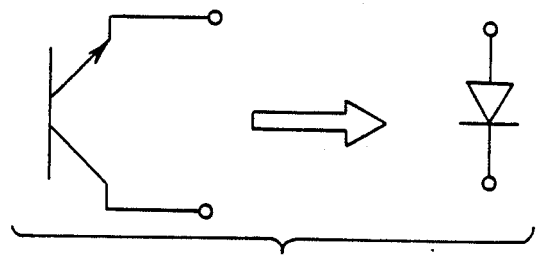
FIG. 1 is a schematic diagram of a prior art bipolar transistor used as a programmable fuse element.
Figure 3:
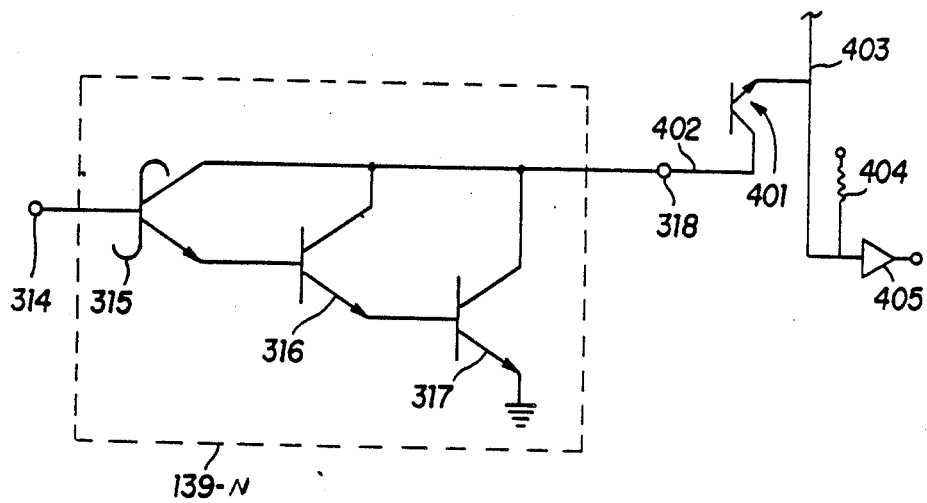
FIG. 3 is a schematic diagram of a typical prior art row driver used during programming, together with a fuse, a column, and a sense amplifier.
Figure 2:
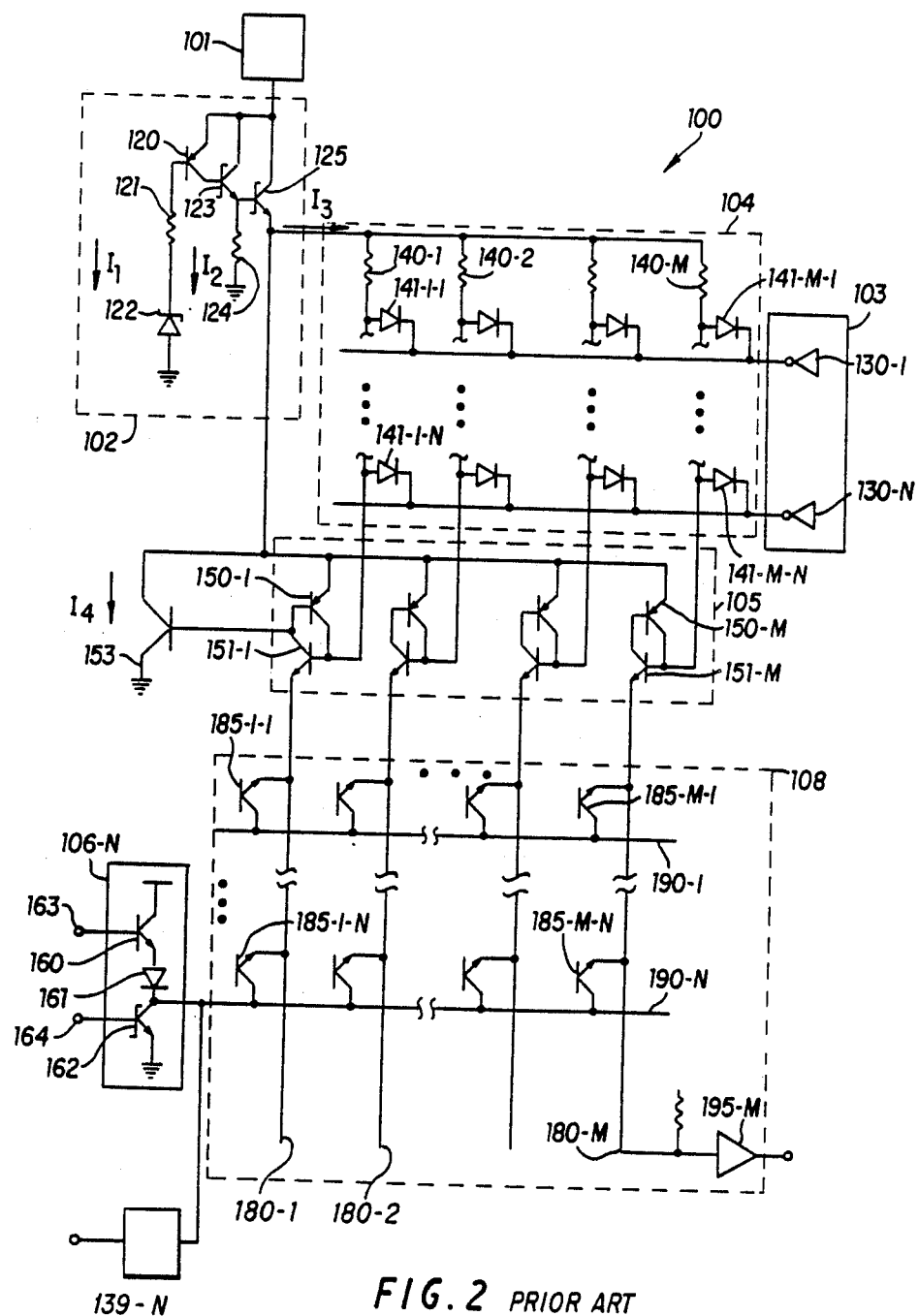
FIG. 2 is a schematic diagram of a typical prior art programmable device.
Figure 4:
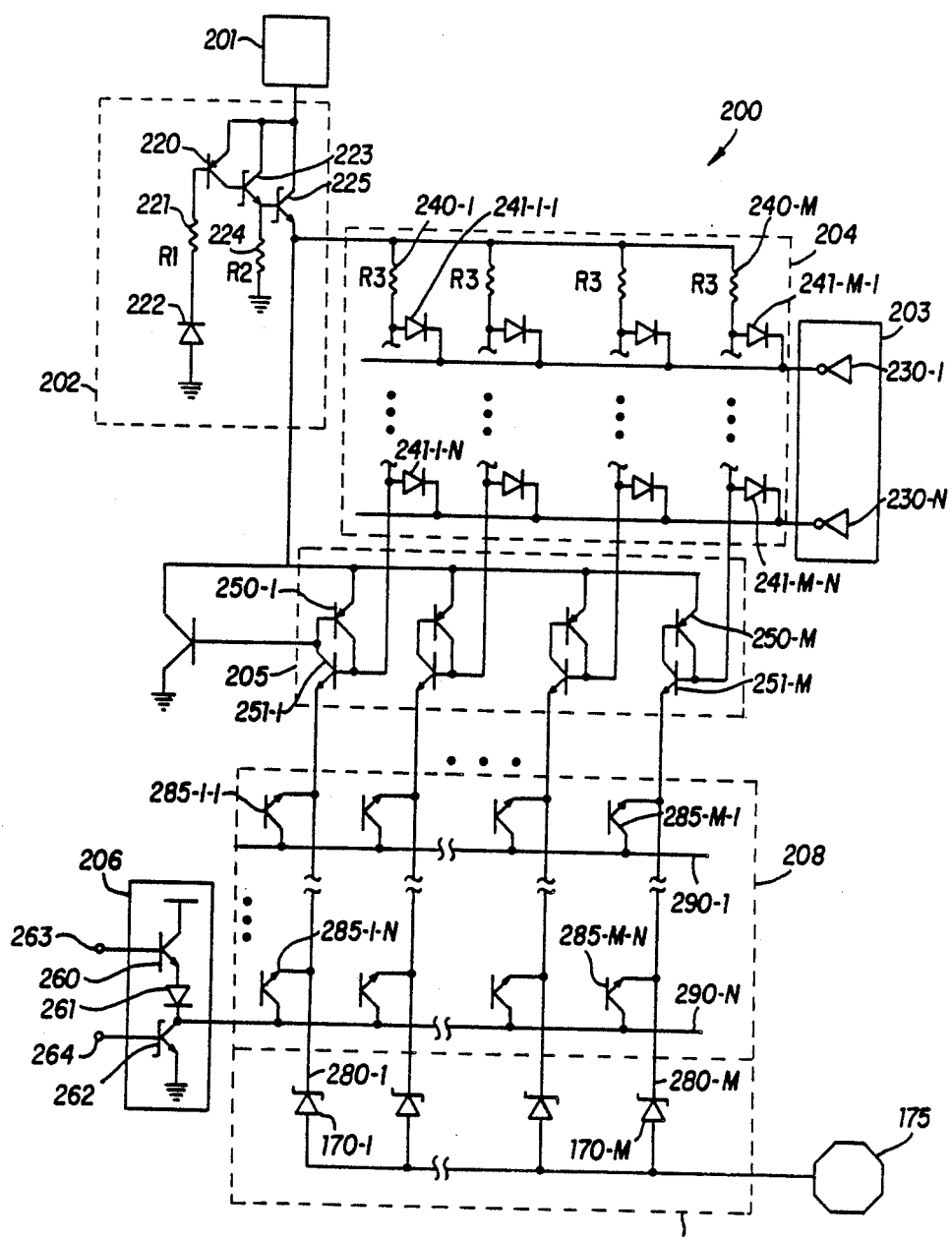
FIG. 4 is a schematic diagram of one embodiment of a programmable device constructed in accordance with the teachings of this invention.

FIG. 4 is a schematic diagram of one embodiment of a programmable device constructed in accordance with the teachings of this invention. Programmable device 200 includes test diodes 170-1 through 170-M, each having their cathodes connected to an associated one of columns 280-1 through 280-M, respectively, and their anodes connected in common to test point 175. Programming and reading of device 200 occurs in the same manner as the prior art circuit of FIG. 2. However, in accordance with the teachings of this invention, measurement of leakage currents through fuses 285-1-1 through 285-M-N is performed in a very precise manner. In the embodiment shown in FIG. 4, during leakage test, no voltage is applied to programming pad 201, and fusing drivers 205 are disabled by appropriate addressing signals applied via decoder 203. Thus, fuse array 208 is completely isolated from the programming circuitry.

In one embodiment of this invention during leakage testing, each of rows 290-1 through 290-N is enabled, and thereby pulled to ground by its respective row driver 206. A leakage test voltage is applied to test pad 175 which is less than the breakdown voltage of the fuses plus the forward bias voltage drop across diodes 170-1 through 170-M. For a typical fuse breakdown voltage of approximately 3.5 volts, and a forward bias diode drop of approximately 0.5 volts, a test voltage of approximately 3.5 volts is used. Assuming some amount of leakage through the fuses, diodes 170-1 through 170-M are forward biased. The total amount of current flowing through diodes 170-1 through 170-M is due to the sum of the leakage currents through fuses 285-1-1 through 285-M-N. This current is easily measured at pad 175 which, for example, is connected to an external pin on the device package. This pin, of course, can be connected to suitable test circuitry or electronic tester for measuring leakage current resulting from the test voltage of approximately 3.5 volts. In an alternative embodiment, pad 175 is not connected to an external pin on the device package, but is used during die sort, prior to packaging, in order to measure leakage currents. In one embodiment of this invention, a device is rejected if the total leakage current is greater than or equal to one microamp. Of interest, it is unimportant whether this leakage current is the result of a large number of fuses leaking or a single fuse leaking, since the leakage current through a column is what will slow down the sensing of that column in a programmable logic device.

In another embodiment of this invention, suitable addressing means (not shown) are utilized to apply the test voltage to a desired one of diodes 170-1 through 170-M such that the test voltage can be applied sequentially to individual columns and the leakage current due to individual columns measured. In this event, for example, a device will be rejected if any individual column has leakage current in excess of one microamp. In another embodiment of this invention, which is particularly well suited for use in programmable read only memories wherein a single fuse is read at any given time, addressing means are used to provide a test voltage to a single one of diodes 170-1 through 170-M in order to detect leakage current from individual columns, and individual row lines are enabled, thereby allowing leakage current to be measured for each individual fuse in the array. In an alternative embodiment of this invention, the anodes of test fuses 170-1 through 170-M are connected in common to a single test point as shown in FIG. 4, but individual row lines are enabled at any given time, thereby allowing the detection of the sum of the leakage currents flowing through the fuses associated with any given row in the array.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A programmable device comprising:
    one or more rows;
    one or more columns;
    a test node for receiving a test signal;
    one or more fuse devices, each fuse device coupled between a unique set consisting of one row and one column;
    one or more means for isolation, each having a first lead coupled to an associated one of said columns, and a second lead, said means for isolation serving to isolate fuse devices from said test node during normal operation of said device;
    means for coupling said test node to said second lead of a selected one of said means for isolation in order to measure leakage current through a selected one or ones of said fuse devices coupled to a column associated with said selected one of said means for isolation to the exclusion of leakage current through other fuse devices not associated with said selected one of said means for isolation.

2. A structure as in claim 1 wherein said means for isolation comprise diodes.

3. A structure as in claim 1 wherein each said fuse comprises a bipolar transistor having an emitter coupled to an associated column, a collector coupled to an associated row, and a base which is floating.

4. A structure as in claim 3 wherein said means for isolation each comprise a diode having a cathode serving as said first lead and an anode serving as said second lead.

5. A structure as in claim 1 further comprising means to enable a plurality of rows simultaneously, such that the current flowing through said selected one of said means for isolating is the sum of the leakage currents flowing through each of said fuses associated with the column associated with said selected one of said means for isolating and said plurality of enabled rows.

6. A structure as in claim 1 further comprising means to selectively enable individual rows, such that the current flowing through said selected one of said means for isolating is the leakage current flowing through the fuse associated with the column associated with said selected one of said means for isolating and associated with the selected row.

7. A programmable device comprising:
    one or more rows;
    one or more columns;
    a test node for receiving a test signal;
    one or more fuse devices, each fuse device coupled between a unique set consisting of one row and one column;
    one or more means for isolation, each having a first lead coupled to an associated one of said columns, and a second lead coupled to said test node, said means for isolation serving to isolate fuse devices from said test node during normal operation of said device;
    means for enabling a selected subset of said rows; and
    means for coupling said test node to said second leads of a selected one or more of said means for isolation in order to measure leakage current through selected ones of said fuse devices coupled to said selected subset of rows and selected columns associated with said selected one or more of said means for isolation to the exclusion of leakage current through other fuse devices not associated with said selected subset of rows and said one or more columns.

8. A structure as in claim 7 wherein said second leads are coupled in common to a common test point for receiving said test signal.

9. A structure as in claim 7 wherein said means for isolation comprise diodes.

10. A structure as in claim 7 wherein each said fuse comprises a bipolar transistor having an emitter coupled to an associated column, a collector coupled to an associated row, and a base which is floating.

11. A structure as in claim 10 wherein said means for isolation each comprise a diode having a cathode serving as said first lead and an anode serving as said second lead.

12. A structure as in claim 7 further comprising means for coupling said test node to all means for isolation simultaneously, such that the current flowing through said means for isolating is the sum of the leakage currents flowing through each of said fuses associated with the selected subset of rows.

13. A structure as in claim 12 wherein said second leads are coupled in common such that the current flowing as a result of said test signal is the sum of the leakage current through said fuses.

14. A structure as in claim 12 wherein said selected subset of rows comprises a single row.

15. A structure as in claim 7 wherein said means for enabling a selected subset of said rows comprises means to selectively enable individual rows, such that the current flowing through said means for isolating is the leakage current flowing through the fuses associated with the columns associated with said one or more of said means for isolating and associated with said selected row.

16. A structure as in claim 15 wherein said second leads are coupled in common such that the current flowing as a result of said test signal is the sum of the leakage current through said fuses associated with said selected row.

* * * * *